(12) United States Patent
Koizumi et al.

(10) Patent No.: US 11,848,224 B2
(45) Date of Patent: Dec. 19, 2023

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Naoyuki Koizumi, Nagano (JP); Kazunori Shimizu, Nagano (JP); Kentaro Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 10 days.

(21) Appl. No.: 17/694,986

(22) Filed: Mar. 15, 2022

(65) Prior Publication Data

US 2022/0301917 A1    Sep. 22, 2022

(30) Foreign Application Priority Data

Mar. 17, 2021   (JP) ................... 2021-044021

(51) Int. Cl.
*H01L 21/683* (2006.01)
(52) U.S. Cl.
CPC ................ *H01L 21/6833* (2013.01)

(58) Field of Classification Search
CPC .................................. H01L 21/6833
See application file for complete search history.

(56) References Cited

U.S. PATENT DOCUMENTS

| | | | |
|---|---|---|---|
| 6,303,879 B1 * | 10/2001 | Burkhart | H01L 23/49827 174/262 |
| 9,518,326 B2 * | 12/2016 | Brown | H01L 21/6831 |
| 2009/0314433 A1 * | 12/2009 | Hoffman | H01L 21/6833 156/345.48 |
| 2010/0212947 A1 | 8/2010 | Yamanaka et al. | |
| 2013/0286531 A1 | 10/2013 | Shiraiwa et al. | |
| 2017/0054390 A1 * | 2/2017 | Chen | B81C 99/002 |
| 2021/0074572 A1 * | 3/2021 | Momiyama | H01L 21/6833 |

FOREIGN PATENT DOCUMENTS

| | | |
|---|---|---|
| JP | 2010-199318 | 9/2010 |
| JP | 2013-229464 | 11/2013 |

* cited by examiner

*Primary Examiner* — Scott Bauer
(74) *Attorney, Agent, or Firm* — Rankin, Hill & Clark LLP

(57) ABSTRACT

An electrostatic chuck includes: a ceramic plate; an adsorption electrode that is built in the ceramic plate; and a plurality of connection pads that are built in the ceramic plate to be electrically connected to the adsorption electrode. The connection pads are arranged stepwise.

10 Claims, 9 Drawing Sheets

FIG.8
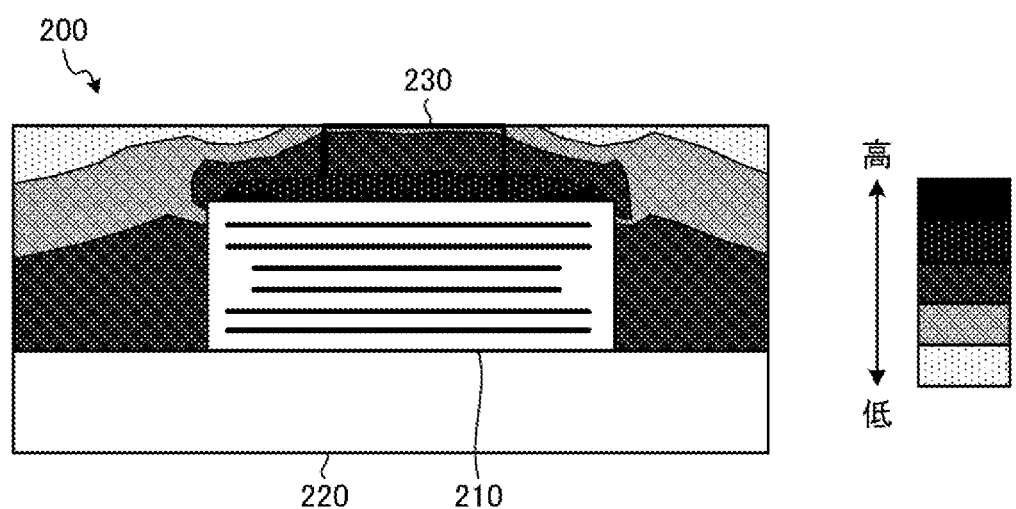
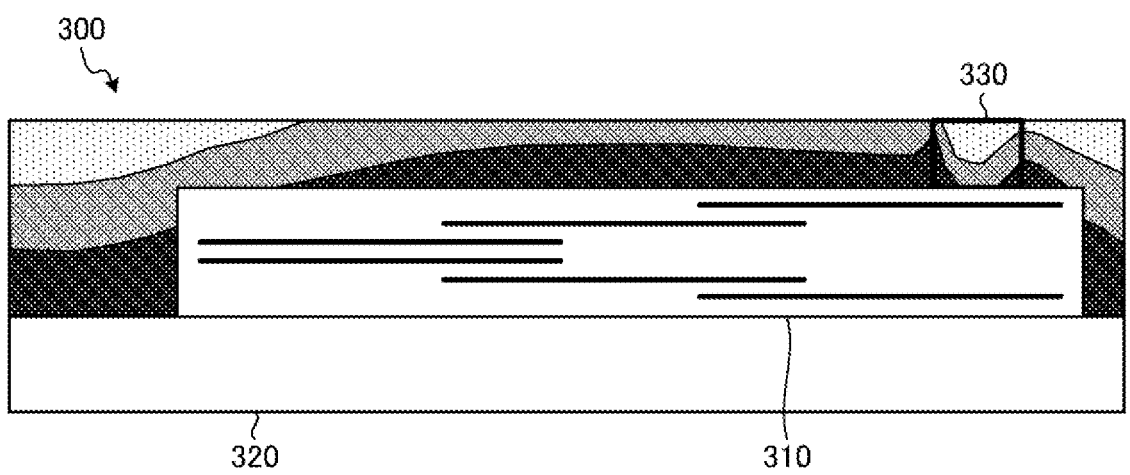

ELECTROSTATIC CHUCK AND SUBSTRATE FIXING DEVICE

This application claims priority from Japanese Patent Applications No. 2021-044021, filed on Mar. 17, 2021, the entire contents of which are herein incorporated by reference.

BACKGROUND

Technical Field

The present disclosure relates to an electrostatic chuck and a substrate fixing device.

Background Art

Typically, a substrate fixing device that adsorbs and holds a wafer, for example, for manufacturing a semiconductor component is provided with an electrostatic chuck (ESC) that is composed of a ceramic plate in which an adsorption electrode is built. The substrate fixing device has a structure in which the electrostatic chuck is fixed to a base plate. Due to a voltage applied to the adsorption electrode built in the ceramic plate, the wafer is adsorbed on the electrostatic chuck by electrostatic force. Since the wafer is adsorbed and held on the electrostatic chuck, processes such as micromachining and etching can be efficiently performed on the wafer.

For example, green sheets made of aluminum oxide and an auxiliary agent are arranged and fired. As a result, the ceramic plate that constitutes the electrostatic chuck is formed. The adsorption electrode is built in the vicinity of an adsorptive face of the ceramic plate. The adsorptive face serves for adsorbing the wafer. On the other hand, the base plate, which supplies a current to the adsorption electrode, is located at a farthest position from the adsorptive face. For this reason, wirings for supplying the current from the base plate to the adsorption electrode are formed inside the ceramic plate.

Specifically, electrically conductive connection pads are formed on the surfaces of the green sheets, and the connection pads on adjacent ones of the green sheets are connected to each other through vias that penetrate the green sheets. In this manner, even when such a plurality of green sheets are arranged, the wirings that connect the base plate and the adsorption electrode to each other can be formed by the connection pads formed on the green sheets and the vias formed in the green sheets (see e.g., JP-A-2013-229464 and JP-A-2010-199318).

However, there is a problem that the electrostatic chuck where the wirings are formed internally may be damaged due to a difference in coefficient of thermal expansion between the ceramic part and the wiring part. Specifically, the green sheets that constitute the ceramic are, for example, mainly made of aluminum oxide as described above, while the connection pads that constitute the wirings are, for example, made of an electric conductor such as tungsten. Since the green sheets are arranged and fired in a state in which the different materials have been mixed, stress is generated at a boundary between the connection pads and the ceramic due to the difference in coefficient of thermal expansion during firing in which the green sheets are heated at high temperature. As a result, cracks may occur in the ceramic, for example, with the circumference of the portion where the connection pads overlap one another, as a starting point.

SUMMARY

Certain embodiment provides an electrostatic chuck. The electrostatic chuck comprises: a ceramic plate; an adsorption electrode that is built in the ceramic plate; and a plurality of connection pads that are built in the ceramic plate to be electrically connected to the adsorption electrode. The connection pads are arranged stepwise.

Certain embodiment provides a substrate fixing device. The substrate fixing device comprises: a base plate; an electrostatic chuck that is fixed to the base plate to adsorb a substrate by electrostatic force. The electrostatic chuck comprising: a ceramic plate; an adsorption electrode that is built in the ceramic plate; and a plurality of connection pads that are built in the ceramic plate to be electrically connected to the adsorption electrode, wherein the connection pads are arranged stepwise.

BRIEF DESCRIPTION OF DRAWINGS

FIG. 8 is a view showing specific examples of a stress distribution;

DETAILED DESCRIPTION OF EMBODIMENT

An embodiment of an electrostatic chuck and a substrate fixing device disclosed by the present application will be described below in detail with reference to the drawings. Incidentally, the present invention is not limited by the embodiment.

Figure 1:
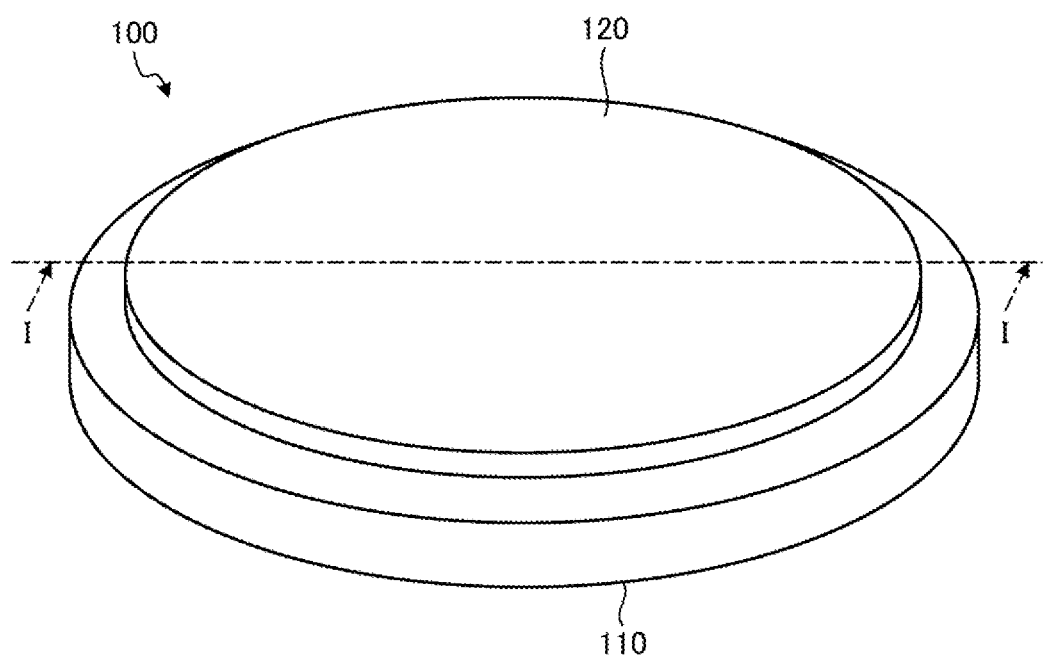
FIG. 1 is a perspective view showing a configuration of a substrate fixing device according to an embodiment.

FIG. 1 is a perspective view of a configuration of a substrate fixing device 100 according to an embodiment. The substrate fixing device 100 shown in FIG. 1 has a structure in which an electrostatic chuck 120 is adhesively bonded to a base plate 110.

The base plate 110 is, for example, a circular member made of metal such as aluminum. The base plate 110 is a base material to which the electrostatic chuck 120 is fixed. When the base plate 110 is, for example, attached to a semiconductor manufacturing apparatus or the like, the substrate fixing device 100 serves as a semiconductor holding device for holding a wafer.

The electrostatic chuck 120 that is adhesively bonded to the base plate 110 uses electrostatic force to adsorb an object such as a wafer thereon. The electrostatic chuck 120 is a circular member smaller in diameter than the base plate 110, and has one face adhesively bonded to the center of the base plate 110. The electrostatic chuck 120 adsorbs the object such as the wafer onto an adsorptive face on an opposite side to the adhesive face that is adhesively bonded to the base plate 110. That is, the electrostatic chuck 120 is made of ceramic in which an adsorption electrode is built in the vicinity of the adsorptive face. When a voltage is applied to the adsorption electrode from the base plate 110, the electrostatic chuck 120 adsorbs the object onto the adsorptive face by the electrostatic force.

Figure 2:
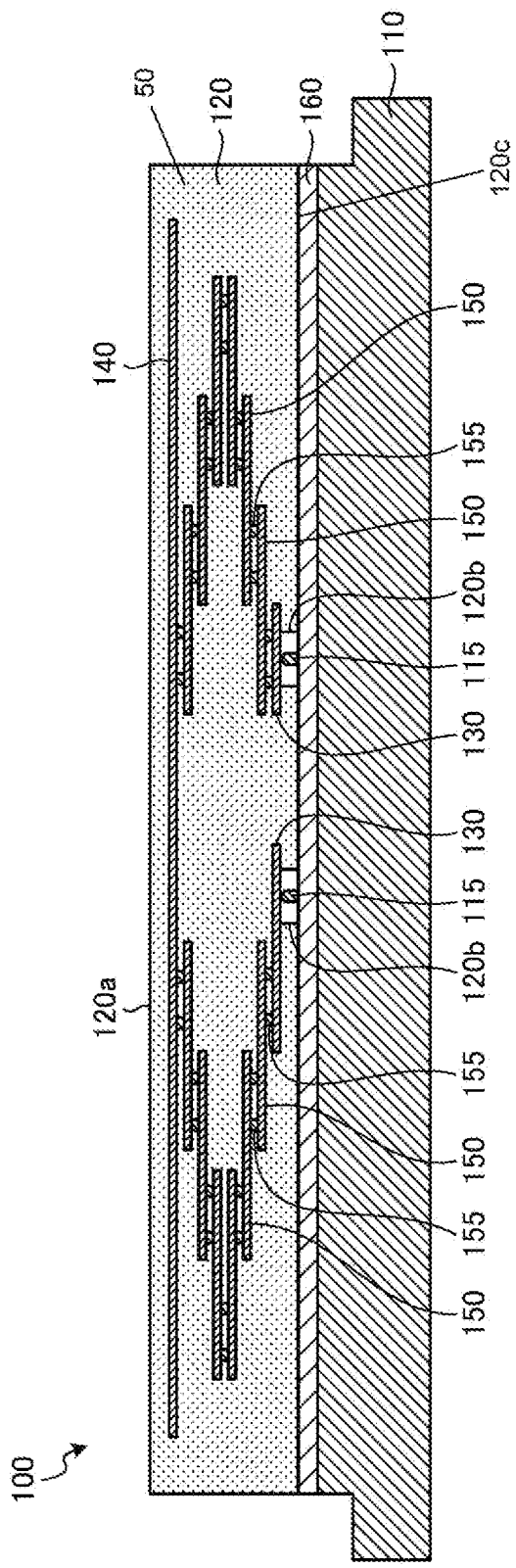
FIG. 2 is a schematic view showing a section of the substrate fixing device according to the embodiment.

FIG. 2 is a schematic view showing a section taken along a line I-I in FIG. 1. As shown in FIG. 2, the substrate fixing device 100 has a configuration in which the electrostatic chuck 120 is adhesively bonded to the base plate 110 through an adhesive layer 160. In the following description, for convenience, a direction from the base plate 110 toward the electrostatic chuck 120 will be referred to as upward direction, and a direction from the electrostatic chuck 120 toward the base plate 110 will be referred to as downward direction. However, the substrate fixing device 100 may be manufactured and used in any position such as an upside down position. In addition, a vertical direction of the electrostatic chuck 120 includes the upward direction and the downward direction to correspond to a thickness direction of the electrostatic chuck 120.

The base plate 110 is a member which is 5 to 100 mm thick and made of metal such as aluminum. Power feed pins 115 protrude from the center of an upper face of the base plate 110. The power feed pins 115 penetrate the adhesive layer 160 to contact wiring pads 130 of the electrostatic chuck 120 to feed electric power to wirings inside the electrostatic chuck 120.

The electrostatic chuck 120 includes a ceramic plate 50 in which the wirings capable of carrying the current are built, and that is, for example, obtained by firing aluminum oxide. Thickness of the electrostatic chuck 120 is, for example, about 1 to 20 mm. Cavities 120b that are recesses where the power feed pins 115 of the base plate 110 can be received are formed in lower portions of the electrostatic chuck 120. Lower faces of the wiring pads 130 are exposed in the cavities 120b. Due to contact of front ends of the power feed pins 115 with the lower faces of the wiring pads 130, electric power can be fed from the base plate 110 to the wirings inside the electrostatic chuck 120.

The ceramic plate 50 has the adsorptive face 120a (upper face) on which an object to be adsorbed such as a substrate can be mounted, and the lower face 120c that is located on the opposite side to the adsorptive face 120a. An adsorption electrode 140 for generating electrostatic force is built in the vicinity of the adsorptive face 120a. The wiring pads 130 and the adsorption electrode 140 are electrically connected to each other through connection pads 150 and vias 155. That is, the connection pads 150 formed into layers (which may be hereinafter also referred to as layer connection pads 150) are arranged between the wiring pads 130 that contact the power feed pins 115 and the adsorption electrode 140. The vias 155 establish connection between the wiring pads 130 and the connection pads 150, between the connection pads 150 adjacent to each other, and between the connection pads 150 and the adsorption electrode 140.

In the configuration shown in FIG. 2, two sets of the wirings are arranged on the left and right sides respectively. The connection pads 150 formed respectively in six layers are arranged between each wiring pad 130 and the adsorption electrode 140. Thus, a corresponding one of the wirings is formed. Hereinafter, the connection pads 150 will be referred to as first- to sixth-layer connection pads 150 sequentially from the connection pad 150 closest to the wiring pad 130.

The connection pads 150 are, for example, formed from an electric conductor such as tungsten as the material. In addition, via holes formed between the connection pads 150 in adjacent layers to each other are filled, for example, with an electric conductor such as molybdenum. Thus, the vias 155 are formed.

The connection pads 150 in the adjacent layers to each other are arranged at a position where they do not overlap each other entirely. That is, for example, pay attention to one of the connection pads 150 in the second layer. In this case, one end of the connection pad 150 in the second layer overlaps a corresponding one of the connection pads 150 in the first layer, while the other end of the connection pad 150 in the second layer does not overlap the corresponding connection pad 150 in the first layer. The other end not overlapping the connection pad 150 in the first layer overlaps a corresponding one of the connection pads 150 in the third layer. Thus, the connection pads 150 are arranged and arranged stepwise in side view so that one end of each of the connection pads 150 overlaps the connection pad 150 laid in a lower layer while the other end of the connection pad 150 overlaps the connection pad 150 laid in an upper layer. In addition, when some of the connection pads 150 are arranged stepwise with a predetermined number of steps, the other connection pads 150 are folded back and arranged stepwise again. That is, for example, in FIG. 2, the connection pad 150 in the third layer and the connection pad 150 in the fourth layer are folded back and arranged. At a position where a connection pad 150 in one layer overlaps a connection pad 150 in another layer adjacent thereto, the connection pads 150 in the two layers are connected through corresponding ones of the vias 155.

In the configuration shown in FIG. 2, one end of each of the connection pads 150 in the first layer overlaps a corresponding one of the wiring pads 130 to be connected thereto through corresponding ones of the vias 155. The other end of the connection pad 150 in the first layer does not overlap the corresponding wiring pad 130, but overlaps one end of a corresponding one of the connection pads 150 in the second layer to be connected thereto through corresponding ones of the vias 155.

In a similar manner or the same manner, one end of each of the connection pads 150 in the second layer overlaps a corresponding one of the connection pads 150 in the first layer to be connected thereto through corresponding ones of the vias 155. The other end of the connection pad 150 in the second layer does not overlap the corresponding connection pad 150 in the first layer, but overlaps one end of a corresponding one of the connection pads 150 in the third layer to be connected thereto through corresponding ones of the vias 155.

The one end of the connection pad 150 in the third layer overlaps the corresponding connection pad 150 in the second layer to be connected thereto through the corresponding vias 155. In addition, since the connection pad 150 in the third layer and the connection pad 150 in the fourth layer are folded back, the connection pad 150 in the third layer and the connection pad 150 in the fourth layer are arranged to entirely overlap each other. The other end of the connection pad 150 in the third layer is connected to one end of the connection pad 150 in the fourth layer through corresponding ones of the vias 155.

The one end of the connection pad 150 in the fourth layer overlaps the connection pad 150 in the third layer to be connected thereto through the corresponding vias 155. The other end of the connection pad 150 in the fourth layer is connected to one end of the connection pad 150 in the fifth layer through corresponding ones of the vias 155.

In a similar manner or the same manner, the one end of the connection pad 150 in the fifth layer overlaps the connection pad 150 in the fourth layer to be connected thereto through the corresponding vias 155. The other end of the connection pad 150 in the fifth layer does not overlap the connection pad 150 in the fourth layer but overlaps one end of the connection pad 150 in the sixth layer to be connected thereto through corresponding ones of the vias 155.

The one end of the connection pad 150 in the sixth layer overlaps the connection pad 150 in the fifth layer to be connected thereto through the corresponding vias 155. The other end of the connection pad 150 in the sixth layer does not overlap the connection pad 150 in the fifth layer but is connected to the adsorption electrode 140 through corresponding ones of the vias 155.

Thus, the connection pad 150 in each of the layers is shifted in position horizontally from the connection pad 50 in an adjacent layer so as to be arranged stepwise. Therefore, the number of the layers of the connection pads 150 in the vertical direction of the electrostatic chuck 120 at a predetermined position can be reduced in comparison with a case where the connection pads in all the layers are arranged to entirely overlap one another. That is, since mounting density in the thickness direction of the connection pads 150 made of the different material from ceramic is reduced, stress generated due to the difference in coefficient of thermal expansion between the ceramic and the connection pads 150 can be reduced. As a result, it is possible to reduce a possibility of damage to the electrostatic chuck 120 including the ceramic and the connection pads 150.

Figure 3:
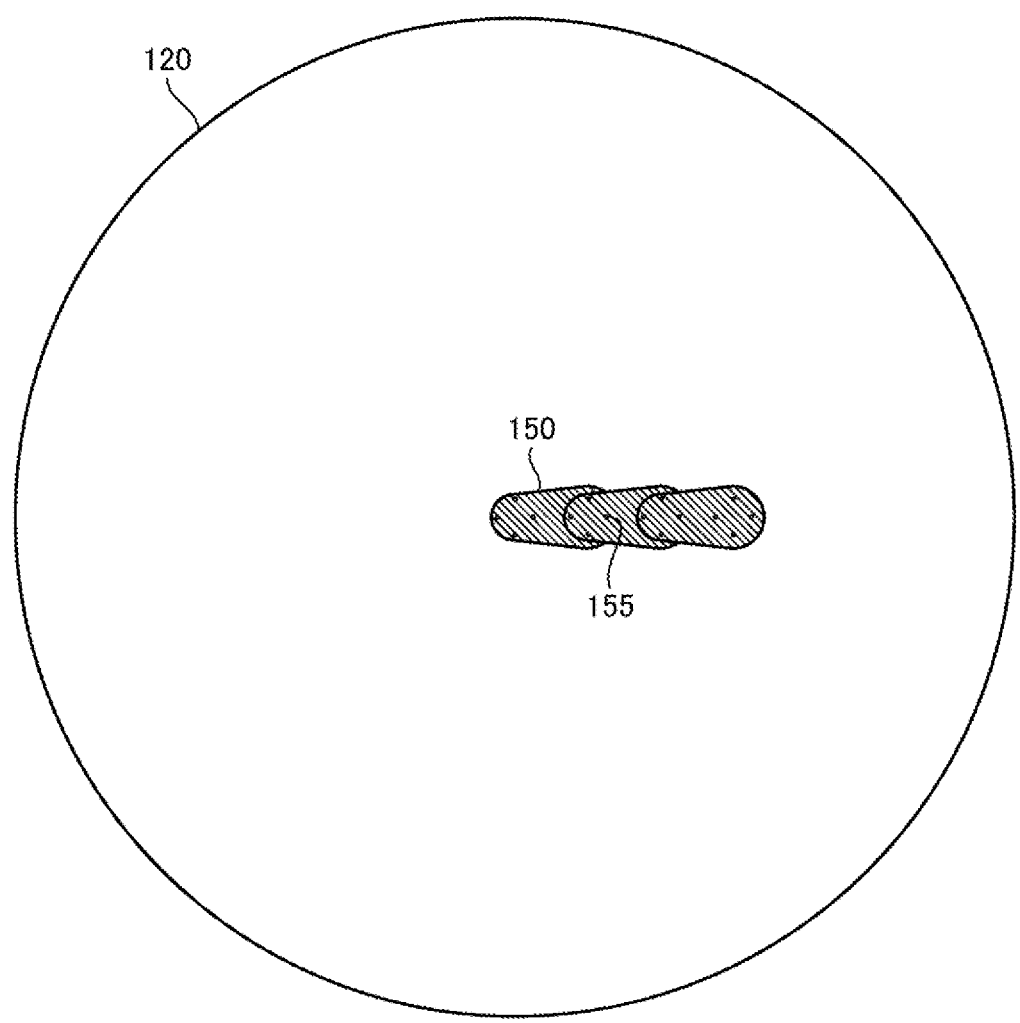
FIG. 3 is a plan view showing a specific example of arrangement of connection pads.

FIG. 3 is a plan view showing a specific example of the arrangement of the connection pads 150. The arrangement of the connection pads 150 in the first to third layers shown in FIG. 2 is illustrated in FIG. 3.

As shown in FIG. 3, the connection pads 150 in the first to third layers are connected in a radial direction from the center of the circular electrostatic chuck 120 to be arranged stepwise. Each of the connection pads 150 in a longitudinal direction is, for example, 15 mm long. The connection pad 150 in the first layer is connected to the wiring pad 130 at the center of the electrostatic chuck 120 through the vias 155. On the other hand, the connection pad 150 in the first layer overlaps the connection pad 150 in the second layer at a position shifted rightward from the center in FIG. 3 so as to be connected to the connection pad 150 in the second layer through the vias 155. Here, the connection pad 150 in the first layer and the connection pad 150 in the second layer are connected through four vias 155.

The connection pad 150 in the second layer overlaps the connection pad 150 in the third layer at a position shifted rightward from the position where the connection pad 150 in the second layer overlaps the connection pad 150 in the first layer so that the connection pad 150 in the second layer can be connected to the connection pad 150 in the third layer through the vias 155. Here, the connection pad 150 in the second layer and the connection pad 150 in the third layer are connected to each other through four vias 155.

Thus, the connection pad 150 in each of the layers is arranged at a position shifted from the connection pad 150 in the upper layer and the connection pad 150 in the lower layer. Therefore, the connection pads 150 are arranged stepwise so that the number of the layers of the connection pads 150 in the vertical direction of the electrostatic chuck 120 at the predetermined position can be reduced. As a result, mounting density of the electric conductor different from the ceramic can be reduced.

Incidentally, the connection pads 150 connected in the radial direction from the center of the electrostatic chuck 120 are illustrated in FIG. 3. However, the connection pads 150 do not have to be connected in the radial direction. In addition, the connection pad 150 in the first layer does not have to be arranged at the center of the electrostatic chuck 120. That is, for example, the connection pads 150 may be connected along a circumferential direction of the electrostatic chuck 120, or the connection pad 150 in the first layer may be arranged at a position different from the center of the electrostatic chuck 120.

Figure 4:
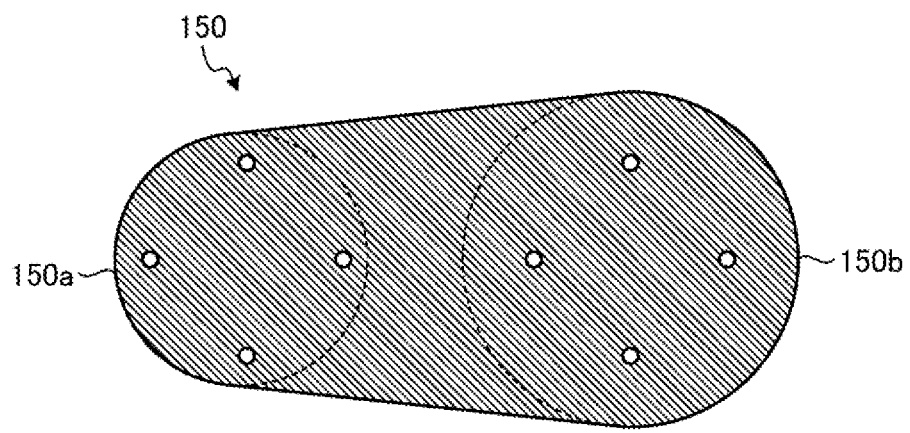
FIG. 4 is a view showing a specific example of the shape of each of the connection pads.

FIG. 4 is a view showing a specific example of the shape of each of the connection pads 150. The connection pad 150 has a shape in which two circles with different diameters are connected by straight lines. That is, the connection pad 150 is formed into the shape of a rounded trapezoid in plan view. The shape of the rounded trapezoid includes a small circle 150a (an example of a first circle) and a large circle 150b (an example of a second circle). The diameter of the large circle 150b is larger than the diameter of the small circle 150a. The outer shape of the rounded trapezoid is defined by a portion of a circumference of the small circle 150a, a portion of a circumference of the large circle 150b, and two common tangent lines shared by the small circle 150a and the large circle 150b. In plan view, the small circle 150a of one of two connection pads 150 adjacent to each other overlaps the large circle 150b of the other connection pad 150. That is, the small circle 150a at one end of the connection pad 150 overlaps the large circle 150b of the connection pad 150 in the lower layer so as to be connected thereto through the vias 155. The large circle 150b at the other end of the connection pad 150 overlaps the small circle 150a of the connection pad 150 in the upper layer so as to be connected thereto through the vias 155.

In this manner, the opposite ends of the connection pad 150 are shaped like the circles with the different diameters. Accordingly, the outer circumference of the connection pad 150 cannot be completely consistent with those of the connection pads 150 in the upper and lower layers at the portions where the connection pad 150 overlaps the connection pads 150 in the upper and lower layers. Therefore, the quantity of the electric conductor per unit area can be made to vary gradually in the vicinity of the outer circumference of the connection pad 150. As a result, stress generated due to a difference in coefficient of thermal expansion between the ceramic and the connection pad 150 can be reduced so that a possibility of damage to the electrostatic chuck 120 can be reduced.

Figure 5:
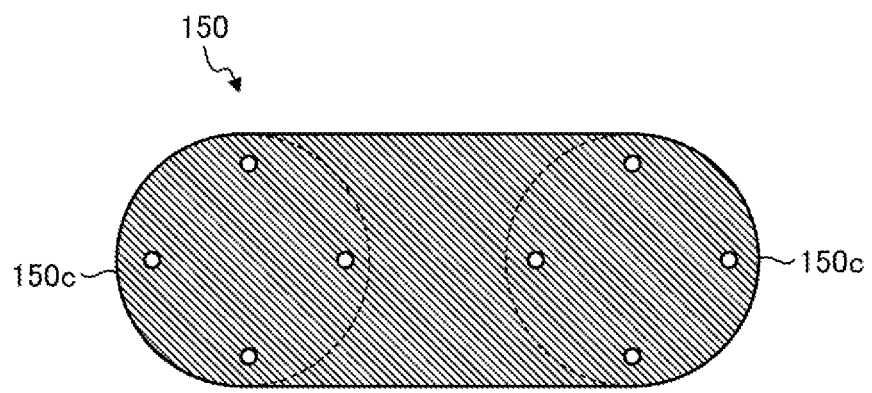
FIG. 5 is a view showing another specific example of the shape of the connection pad.
Figure 6:
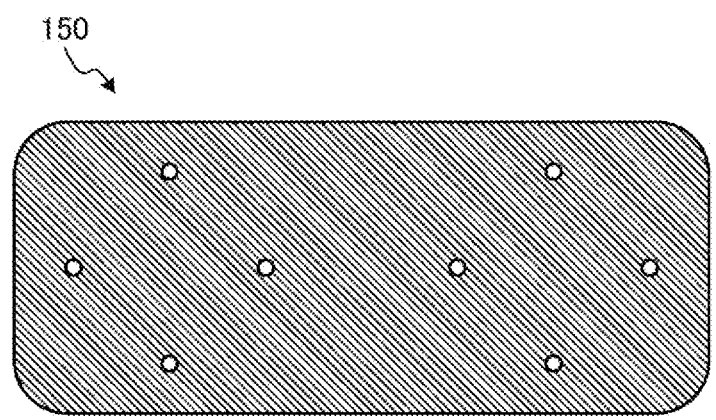
FIG. 6 is a view showing a further specific example of the shape of the connection pad.

Incidentally, the shape of the connection pad 150 is not limited to the shape of the rounded trapezoid shown in FIG. 4, but may be any of various other shapes. For example, the connection pad 150 may be formed into the shape of a rounded rectangle in plan view, as shown in FIG. 5. The shape of the rounded rectangle includes two circles 150c equal in diameter to each other. The outer shape of the rounded rectangle is defined by portions of circumferences of the two circles 150c, and two common tangent lines shared by the two circles 150c. In addition, for example, as shown in FIG. 6, the connection pad 150 may be shaped like a rounded rectangle that is not formed into semicircles at its opposite ends. Even with any of the shapes, one end of the connection pad 150 in the longitudinal direction can be connected to the connection pad 150 in the lower layer through the vias 155, and the other end of the connection pad 150 in the longitudinal direction can be connected to the connection pad 150 in the upper layer through the vias 155.

Figure 7:
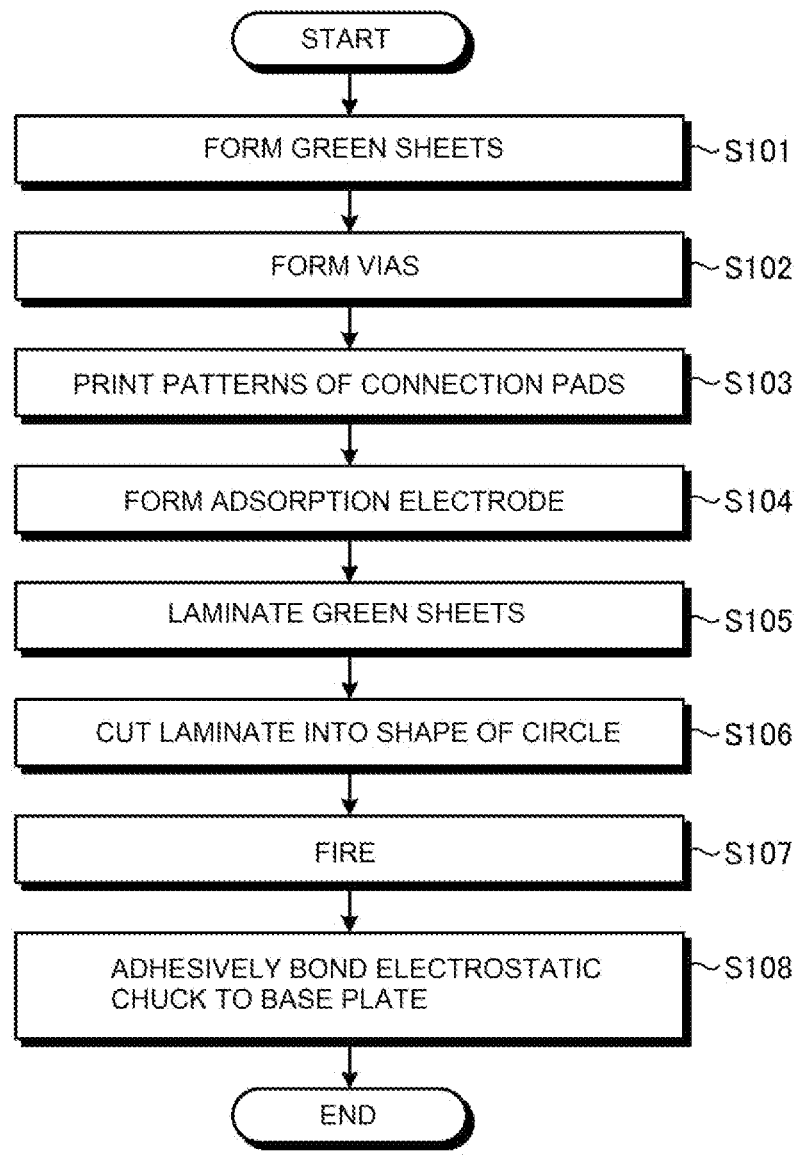
FIG. 7 is a flow chart showing a method for manufacturing the substrate fixing device according to the embodiment.

Next, a method for manufacturing the substrate fixing device 100 according to the embodiment will be described with reference to a flow chart shown in FIG. 7.

First, a plurality of green sheets are produced in order to form an electrostatic chuck 120 (Step S101). Specifically, for example, aluminum oxide and a predetermined auxiliary agent are mixed. As a result, a slurry-like mixture obtained thus is dried so that the green sheets are produced. Each of the green sheets is, for example, a square sheet which is 500 mm long, 500 mm wide and 0.7 mm thick.

Vias 155 for connecting adjacent layer connection pads 150 to each other are formed in each of the green sheets (Step S102). Specifically, via holes penetrating the green sheet are formed at positions where the adjacent layer connection pads 150 can overlap each other. The via holes are filled with an electric conductor such as molybdenum to form the vias 155. The positions where the vias 155 are formed correspond to the positions of the connection pads 150 which should be connected through the vias 155. Thus, the positions of the vias 155 differ from one green sheet to another. Incidentally, in a manner similar to or the same as the via holes, cavities 120b are also formed from through holes that penetrate green sheets. That is, the through holes of the green sheets arranged on each other are joined to each other so as to form openings to thereby form the cavities 120b.

A pattern of a connection pad 150 is printed on each of the green sheets where the vias 155 have been formed (Step S103). That is, a paste of metal such as tungsten is printed on the surface of the green sheet so as to form the connection pad 150 having the shape shown in any of FIGS. 4 to 6. In addition, an adsorption electrode 140 is formed on the green sheet that is arranged in vicinity of an adsorptive face 120a of the electrostatic chuck 120 (Step S104).

The green sheets in which the connection pads 150 and the adsorption electrode 140 have been formed in this manner are arranged in the sequence in which the adjacent layer connection pads 150 and the adsorption electrode 140 can be connected through the vias 155 (Step S105). A laminate of the green sheets is then cut into the shape of a circle in accordance with the shape of a base plate 110 (Step S106).

The laminate cut into the shape of the circle is fired in a firing furnace to be changed into ceramic (Step S107). On this occasion, the connection pads 150 made of the different material from the green sheets are formed on the green sheets respectively, but the positions of the layer connection pads 150 are shifted from one another so that the layer connection pads 150 are arranged stepwise. Accordingly, the quantity of the connection pads 150 per unit area is so small that it is possible to reduce stress generated due to a difference in coefficient of thermal expansion. Therefore, it is possible to reduce a possibility of cracks occurring in the ceramic even during firing in which the laminate is exposed to high temperature.

Thickness of the circular plate of the ceramic obtained by the firing is, for example, about 10 mm. Due to contraction of the laminate caused by the firing, the thickness of the circular plate becomes thinner than thickness of the laminate before the firing. The circular plate of the ceramic formed in this manner serves as the electrostatic chuck 120. The electrostatic chuck 120 is adhesively bonded to the metal base plate 110 by an adhesive layer 160 (Step S108). For example, a bond material can be used to form the adhesive layer 160. Thus, the substrate fixing device 100 is completed.

FIG. 8 is a view showing specific examples of stress distributions generated in electrostatic chucks in each of which a wiring is built. An upper drawing of FIG. 8 shows a stress distribution in an electrostatic chuck 200 in which connection pads are arranged so as to overlap one another entirely in a wiring area 210. A lower drawing of FIG. 8 shows a stress distribution in an electrostatic chuck 300 in which connection pads are arranged stepwise in a wiring area 310.

In the electrostatic chuck 200 shown in the upper drawing of FIG. 8, an adsorptive face 220 is located on a lower side and a cavity 230 is located on an upper side. In the electrostatic chuck 200, stress is high on opposite sides of the cavity 230 especially above the wiring area 210. That is, due to the connection pads that are arranged so as to entirely overlap one another in the wiring area 210, density of the connection pads in the wiring area 210 is high. Therefore, there is a large difference in the density of the connection pads between the inside and the outside of the wiring area 210. As a result, stress becomes high in an outer circumferential portion of the wiring area 210 due to a difference in coefficient of thermal expansion between the connection pads and ceramic.

On the other hand, in the electrostatic chuck 300 shown in the lower drawing of FIG. 8, an adaptive face 320 is also located on a lower side and a cavity 330 is also located on an upper side. In the electrostatic chuck 300, stress becomes low even in an outer circumferential portion of the wiring area 310 in comparison with that in the electrostatic chuck 200. That is, due to the connection pads that are arranged stepwise inside the wiring area 310, density of the connection pads in the wiring area 310 is low. Therefore, it is possible to reduce a difference in the density of the connection pads between the inside and the outside of the wiring area 310 so that it is possible to suppress stress generated in the outer circumferential portion of the wiring area 310. As a result, it is possible to reduce a possibility of damage to the ceramic such as occurrence of cracks due to the stress in the electrostatic chuck 300, in comparison with that in the electrostatic chuck 200.

According to the present embodiment as described above, the connection pads that electrically connect the base plate and the adsorption electrode of the electrostatic chuck to each other are arranged stepwise so as not to entirely overlap one another. Thus, the overlapping portions between the connection pads in the adjacent layers are connected to each other through the vias. Therefore, due to the reduction in the number of the layers of the connection pads in the vertical direction of the electrostatic chuck 300 at a predetermined position, mounting density of the connection pads in the vertical direction can be reduced. Thus, it is possible to reduce stress generated due to a difference in coefficient of thermal expansion between the ceramic and the connection pads so that it is possible to reduce a possibility of damage to the electrostatic chuck including the ceramic and the connection pads.

Figure 9:
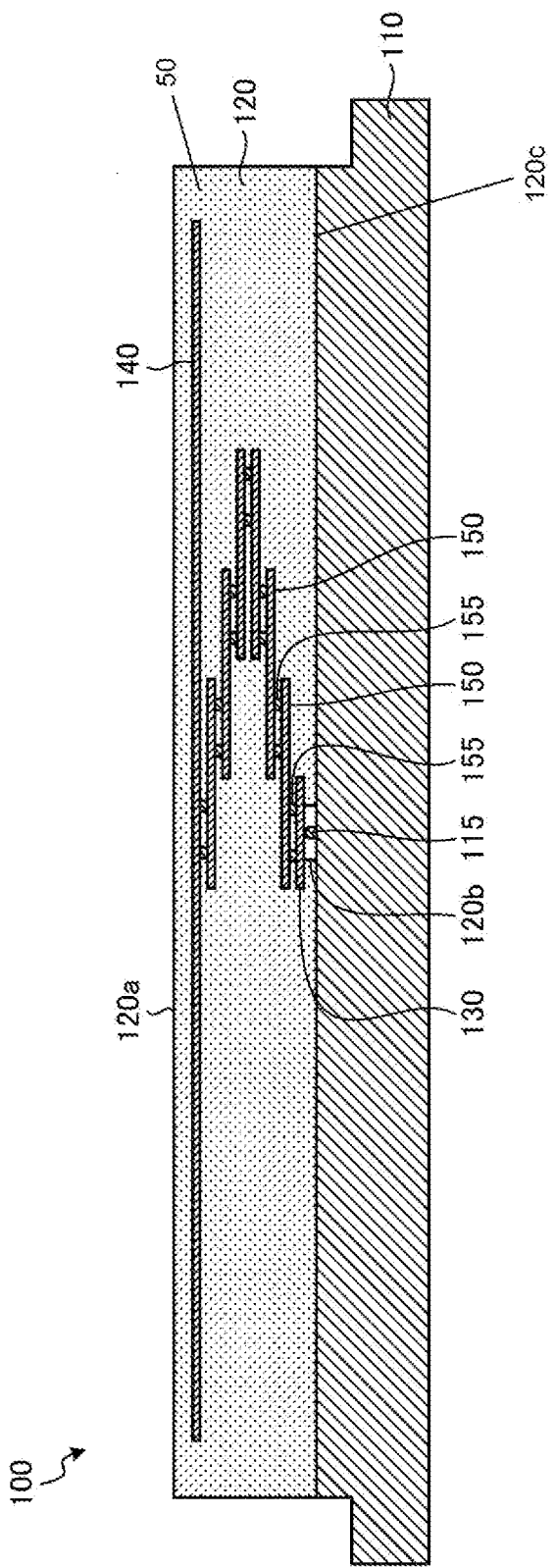
FIG. 9 is a view showing a modification of the substrate fixing device.

Incidentally, in the aforementioned embodiment, the electrostatic chuck 120 is adhesively bonded to the base plate 110 by the adhesive layer 160. However, the base plate 110 and the electrostatic chuck 120 do not have to be adhesively bonded by an adhesive agent. For example, the electrostatic chuck 120 may be fixed to the base plate 110 by a means such as screwing. In this case, for example, as shown in FIG. 9, the adhesive layer 160 is absent, but a power feed pin 115 of a base plate 110 protrudes into a cavity 120b to contact a lower face of a wiring pad 130.

In the aforementioned embodiment, the connection pads are arranged stepwise so that the intermediate-layer connection pads arranged between the uppermost-layer connection pad and the lowermost-layer connection pad are folded back. However, the present embodiment is not limited thereto. In this respect, the connection pads may be folded back at the predetermined position in the vertical direction of the electrostatic chuck. In addition, the connection pads do not have to be folded back to be arranged. That is, the connection pads 150 between the wiring pad 130 and the adsorption electrode 140 may be arranged stepwise without being folded back.

Figure 10:
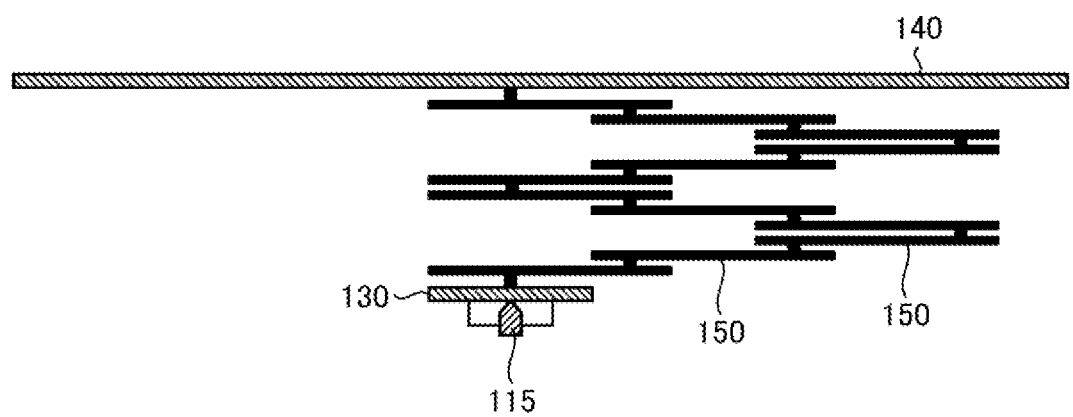
FIG. 10 is a view showing a modification of the arrangement of the connection pads.

In addition, when the connection pads are folded back, the number of folding-back times is not limited to one (i.e. one reciprocation). That is, for example, as shown in FIG. 10, connection pads 150 arranged stepwise between a wiring pad 130 that contacts a power feed pin 115 and the adsorption electrode 140 may be folded back three times (i.e. two reciprocations).

Since the connection pads 150 are arranged stepwise regardless of whether they are folded back or not, it is possible to reduce the mounting density of the connection pads 150 in the vertical direction of the electrostatic chuck at the predetermined position so that it is possible to reduce a possibility of damage to the electrostatic chuck 120, in comparison with that in the case where the connection pads 150 entirely overlap one another to be arranged on one another.

The substrate fixing device 100 according to the aforementioned embodiment can be, for example, attached to a semiconductor manufacturing apparatus and function as a semiconductor holding device for holding a semiconductor. In addition, even in a case where a temperature control device has a configuration in which a temperature controller for heating or cooling a semiconductor component is added to the substrate fixing device 100 according to the aforementioned embodiment, the substrate fixing device 100 can function as the semiconductor holding device.

Although the preferred embodiments etc. have been described above in detail, the present disclosure is not limited to the aforementioned embodiments etc., and various modifications and substitutions can be added to the aforementioned embodiments etc. without departing from the scope described in Claims.

What is claimed is:

1. An electrostatic chuck comprising:
   a ceramic plate;
   an adsorption electrode that is built in the ceramic plate; and
   a plurality of connection pads that are built in the ceramic plate to be electrically connected to the adsorption electrode,
   wherein the plurality of connection pads comprise:
      an uppermost-layer connection pad;
      a lowermost-layer connection pad; and
      intermediate-layer connection pads that are arranged between the uppermost-layer connection pad and the lowermost-layer connection pad in the vertical direction, and
   wherein the connection pads are arranged stepwise such that the intermediate-layer connection pads are folded back.

2. The electrostatic chuck according to claim 1,
   wherein the ceramic plate comprises an adsorptive face on which an object to be adsorbed is to be mounted, and a lower face that is opposite to the adsorptive face, and
   wherein the connection pads are arranged between the adsorption electrode and the lower face in a vertical direction of the electrostatic chuck.

3. The electrostatic chuck according to claim 1,
   wherein the connection pads comprises:
   a first connection pad,
   a second connection pad, and
   a third connection pad that is adjacent to the first connection pad and the second connection pad in a vertical direction of the electrostatic chuck, and
   wherein in plan view, a portion of the third connection pad partially overlaps the first connection pad, and another portion of the third connection pad partially overlaps the second connection pad.

4. The electrostatic chuck according to claim 1, further comprising:
   at least one via configured to connect adjacent ones of the connection pads.

5. The electrostatic chuck according to claim 4,
   wherein the at least one via comprises:
   at least one first via configured to connect adjacent ones of the connection pads; and
   at least one second via configured to connect the adsorption electrode and one of the connection pads.

6. The electrostatic chuck according to claim 1,
   wherein each of the connection pads is formed into a shape of a rounded quadrilateral in plan view.

7. The electrostatic chuck according to claim 6,
   wherein each of the connection pads is formed into a shape of a rounded trapezoid in plan view,
   wherein the shape of the rounded trapezoid comprises a first circle having a first diameter, and a second circle having a second diameter larger than the first diameter, and
   wherein an outer shape of the rounded trapezoid is defined by a portion of a circumference of the first circle, a portion of a circumference of the second circle, and two common tangent lines shared by the first circle and the second circle.

8. The electrostatic chuck according to claim 7,
   wherein the plurality of connection pads comprise a first connection pad, and a second connection pad that is adjacent to the first connection pad in a vertical direction of the electrostatic chuck, and
   wherein the first circle of the first connection pad overlaps the second circle of the second connection pad in plan view.

9. The electrostatic chuck according to claim 6,
   wherein each of the connection pads is formed into a shape of a rounded rectangle in plan view,
   wherein the shape of the rounded rectangle comprises: a first circle having a first diameter, and a second circle having a second diameter equal to the first diameter, and
   wherein an outer shape of the rounded rectangle is defined by a portion of a circumference of the first circle, a portion of a circumference of the second circle, and two common tangent lines shared by the first circle and the second circle.

10. A substrate fixing device comprising:
    a base plate;
    an electrostatic chuck that is fixed to the base plate to adsorb a substrate by electrostatic force, the electrostatic chuck comprising:
    a ceramic plate;
    an adsorption electrode that is built in the ceramic plate; and a plurality of connection pads that are built in the ceramic plate to be electrically connected to the adsorption electrode,
wherein the plurality of connection pads comprise:
an uppermost-layer connection pad;
a lowermost-layer connection pad; and
intermediate-layer connection pads that are arranged between the uppermost-layer connection pad and the lowermost-layer connection pad in the vertical direction, and
wherein the connection pads are arranged stepwise such that the intermediate-layer connection pads are folded back.

* * * * *